310-322 SR
11/1/77 OR 4,056,741

United States Patent [19]

Hoerz et al.

[11] 4,056,741
[45] Nov. 1, 1977

[54] AUDIBLE SIGNAL GENERATING APPARATUS HAVING SELECTIVELY CONTROLLED AUDIBLE OUTPUT

[75] Inventors: Richard D. Hoerz; Donald J. Propp, both of Madison, Wis.

[73] Assignee: Airco, Inc., Montvale, N.J.

[21] Appl. No.: 677,954

[22] Filed: Apr. 19, 1976

Related U.S. Application Data

[60] Continuation of Ser. No. 534,050, Dec. 18, 1974, abandoned, which is a division of Ser. No. 352,145, April 18, 1973, Pat. No. 3,872,470.

[51] Int. Cl.[2] .............................................. H01L 41/04
[52] U.S. Cl. ....................................... 310/322; 310/330
[58] Field of Search ................... 310/8.2, 8.3, 8.5, 8.6, 310/8.7, 9.1, 9.4; 179/110 A; 340/384 E

[56] References Cited

U.S. PATENT DOCUMENTS

| | | | |
|---|---|---|---|
| 3,271,596 | 9/1966 | Brinkerhoff | 310/8.7 |
| 3,331,970 | 7/1967 | Dundon et al. | 310/9.1 |
| 3,577,020 | 5/1971 | Carlson | 310/8.2 |
| 3,708,702 | 1/1973 | Brunnert et al. | 310/8.2 |
| 3,860,838 | 1/1975 | Kumon | 310/8.5 |

*Primary Examiner*—Mark O. Budd
*Attorney, Agent, or Firm*—Roger M. Rathbun; David L. Rae; Edmund W. Bopp

[57] ABSTRACT

A ceramic crystal transducer is connected to a direct current supply in series with a pair of transistors. A pair of independent multivibrator oscillators are connected, each controlling one of the transistors. Each oscillator establishes a rectangular wave and is provided with a continuously adjustable resistor for controlling the output frequency of the corresponding oscillator. The one oscillator is constructed to produce a frequency and a voltage to excite the crystal at the order of the natural resonant frequency and to thereby produce an audio output signal. The second multivibrator oscillator selectively controls the second transistor to control the on/-off or pulsing rate of the tone related audible signal. The crystal is pulsed at the output rate of the tone oscillator and vibrates at the fundamental frequency of the rectangular wave as well as harmonics to either side of such fundamental frequency to produce a full and pleasant sound. Variation of the repetition rate of the output signal of the tone generator to either side of the natural resonant frequency of the crystal correspondingly varies the pitch and intensity of the emitted sound to distinguish adjacent alarms. The pulse rate oscillator permits further distinction by adjustment of the signal duty cycle.

1 Claim, 5 Drawing Figures

Fig. 3
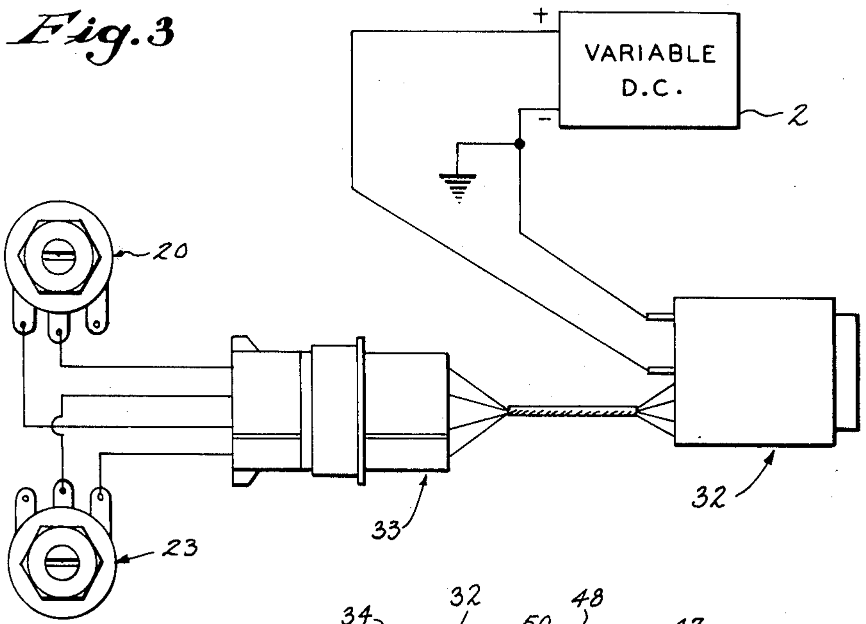
Fig. 4
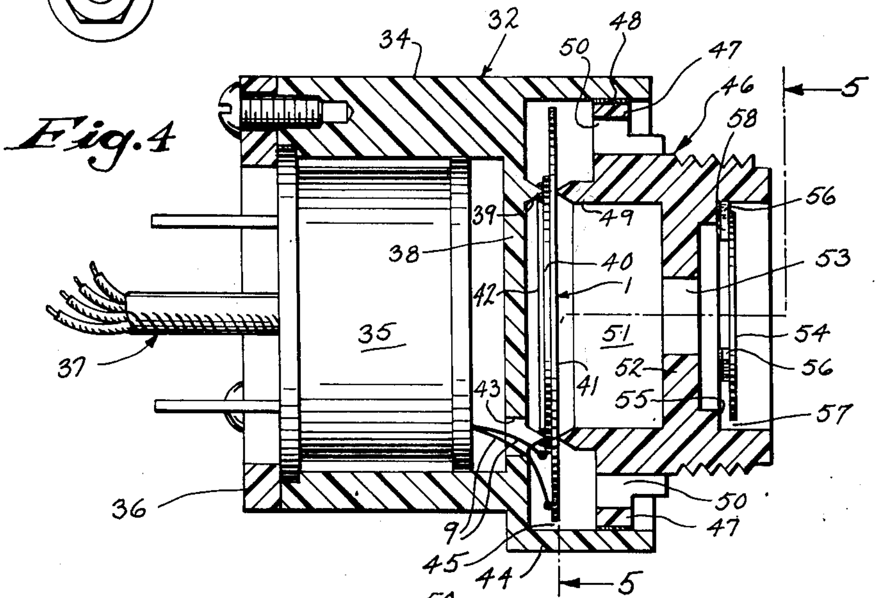
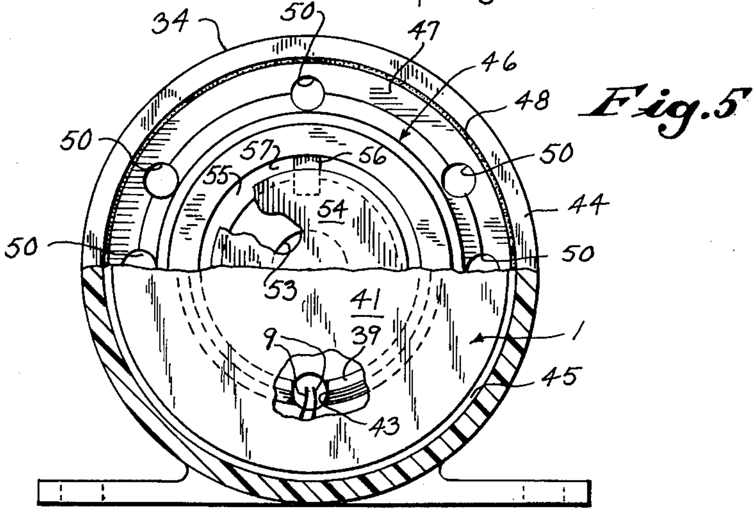
Fig. 5

AUDIBLE SIGNAL GENERATING APPARATUS HAVING SELECTIVELY CONTROLLED AUDIBLE OUTPUT

This is a continuation of application Ser. No. 534,050, filed Dec. 18, 1974, now abandoned, which is a division of application Ser. No. 352,145, filed Apr. 18, 1973, now U.S. Pat. No. 3,872,470.

This invention relates to an audible signal generating apparatus having means to selectively establish the audible output characteristic.

Audible signals, particularly for alarm conditions and the like, have advantages over visual type signals, particularly with respect to the ability of attracting the attention of the necessary personnel. Steady state audible signals, such as provided by certain horns, buzzers and similar driven devices, may, however, be masked by relatively high noise levels in the adjacent environment or ambient. Further, personnel with various hearing defects have difficulty hearing particular noise levels or audible signals of a particular frequency. Various systems have therefore been provided to produce a pulsed or beep type sound by establishing a fixed frequency signal with a fixed rate of interruption of such signal. The sound interruption may be controlled by an on/off device or by a level modulating device to control the output signal between various levels and produce a warble type signal. For example, U.S. Pat. No. 3,487,404 discloses a pair of multi-vibrators or oscillators interconnected to drive an output horn. Under one condition, only one of the oscillators drives the horn to indicate for example a fire alarm condition. In response to a burglar or other alternate alarm condition, the same oscillator output drives the horn, but the second oscillator modulates the first oscillator to provide a warbled output. A pair of cascaded multivibrators for a similar application is shown in the IBM Technical Disclosure Bulletin of March 1972, Volume 14, No. 10. A similar concept is shown in U.S. Pat. No. 3,693,110 employing a pair of cascaded unijunction oscillators driving a speaker. In the latter patent, switch means are provided for adjusting the tone frequency and/or the modulating frequency. Although such systems have been employed there are certain disadvantages from the standpoint of size, complexity and power requirements.

The development of ceramic transducers of an electro-acoustical nature has permitted the construction of an audible alarm which avoids some of the disadvantages of the prior art devices. A ceramic crystal has a natural resonant frequency and when excited electrically by an audio frequency signal, it tends to mechanically oscillate by itself as a result of its physical construction. When activated, the oscillating crystal creates a high intensity air vibration which of course is related to and provides a sound of the corresponding frequency. For example, a crystal alarm is disclosed in U.S. Pat. No. 3,569,963 with such a ceramic transducer connected in the feedback path of an audio tone oscillator. The oscillator produces a sine wave output at the natural frequency of the crystal and which is applied to the transducer, resulting in high frequency vibration thereof with a corresponding audible output. To provide an interrupted signal, a sub-audio frequency driver is connected to turn the main oscillator on and off and thereby provide an interrupted output tone signal. The use of the ceramic transducer reduces the power requirements as well as the size and complexity of the system and thus provides very distinct advantages from a practical standpoint. Such ceramic transducers are driven essentially from a sinusoid to provide maximum efficiency with minimum power input. Thus, the maximum audible intensity signal is derived when the mechanical vibration of the crystal is energized at its natural resonant frequency. The oscillator is driven from a fixed DC signal source and generates a sinusoidal driving signal at the resonant frequency in order to provide the desired efficiency.

Although alarm devices are widely employed in industry and the like they are also advantageously applied to more sophisticated and complex equipment, for example: for monitoring and/or controlling medical and physiological functions. For example, hospital areas for cardiac patients provide various monitoring systems for continuously monitoring the condition of the patient's heart. Similarly, infant pulse monitors, respirator monitors and vaporizer controllers and the like may employ various alarms including audible units for drawing attention to an abnormal condition.

With present day alarm systems, the several monitoring devices are normally provided in one or more control areas and the medical personnel on duty upon receipt of an alarm must search through the various devices to detect which alarm oriented system has been activated to indicate an out-of-tolerance perameter.

Further, in present monitoring devices, amplitude control is provided by varying of a supply voltage. A combined adjustment in amplitude, pitch and rate thus require three separate adjustments.

There is, therefore, a need for a small, compact and reliable alarm device which will permit convenient control and selection of the audible output characteristic to permit distinction between adjacent alarms and preferably may include an interrelated visual indicator such as a lamp.

SUMMARY OF THE PRESENT INVENTION

The present invention is particularly directed to a crystal type audible alarm supplied with a non-sinusoidal driving signal for selectively and conjointly controlling the frequency of excitation to control the tone and the amplitude of the alarm signal with a fuller sound characteristic. In the optimum construction, individually and separately controlled means are provided for generating an interrupted tone signal, thereby providing apparatus with only two adjustments for controlling of the output characteristic.

Generally in accordance with the present invention, an electro-acoustical ceramic or similar piezoelectric crystal is coupled to a power supply with means to selectively excite the crystal from a non-sinusoidal signal generator over a broad range of frequency of the order of the natural resonant frequency of the crystal. In a preferred construction the crystal is excited from a rectangular wave tone generator. As a result the crystal will oscillate at a basic fundamental frequency related to the fundamental frequency of the rectangular wave as well as the harmonics to either side of such fundamental frequency. The "heard" sound therefore includes both the basic and harmonic frequencies and will be a much fuller and more pleasant sound, rather than a piercing monotone which is generally created from the accepted sinusoidal excitation of the crystal. In addition, the generator includes means for varying the basic repetition rate thereof from the natural resonant frequency of the crystal. The excitation of the crystal by a rectangular or square wave operating at the natural resonant frequency of the crystal will produce a corresponding basic frequency sound signal of a maximum loudness level. Variation of the repetition rate of the output signal of the tone generator to either side of such point varies the tone of the sound. Further, the varying of the excitation either above or below the resonant frequency of the crystal also results in a corresponding decrease in the intensity of the emitted sound from the electro-acoustical crystal. The variable duty cycle tone generator will thus provide a combined amplitude and tone control permitting ready distinction of closely adjacent alarms by separately setting of the several devices. More effective monitoring of various conditions is therefore created.

The breadth and scope of the system can be further increased by the incorporation of a variable duty cycle rate generator which functions to continuously control the coupling of the tone generator to the crystal and therefrom provides a selective interruption of each of the basic signals created by the tone generator.

In a particular satisfactory and novel feature of the present invention, a pair of solid state switches such as transistors selectively connect the crystal to a power supply connection means. A pair of independent multivibrator oscillators are connected, one each controlling the transistors switch means. Each oscillator is provided with a continuously variable rate adjustment means for controlling the output frequency of the corresponding oscillator. The one oscillator is constructed to produce a frequency and a voltage to excite the crystal at the order of the natural resonant frequency and to thereby produce an audio output signal. The second multivibrator oscillator selectively controls the second transistor to control the on/off or pulsing rate the the tone related audible signal.

The total unit can be readily packaged as a small compact unit having a pair of external adjustments for selectively setting each of the oscillators to produce any desired combination. Thus each multivibrator oscillator can be conveniently provided with a potentiometer having an external control which can be readily adjusted from the exterior portion of the package of the unit.

One or more of the alarms are then coupled to the various devices to be monitored, with suitable sensing means for activating the alarms in response to a particular condition. Each unit is set to provide a unique combination of a tone signal, based on the tone and amplitude of the sound as well as the pulsing of the corresponding unique sound.

The present invention thus provides a very versatile and readily controlled alarm particularly adapted for detection of a plurality of conditions in close proximity.

DESCRIPTION OF DRAWINGS

The drawings furnished therewith illustrate a preferred construction of the present invention in which the above advantages and features are clearly disclosed as well as others which will be readily understood from the following description of such illustrated embodiment.

In the drawings:

FIG. 3 is a diagrammatic view of the components shown in FIGS. 1 and 2;

FIG. 4 is an enlarged cross sectional view through a crystal mounting unit shown in FIG. 3; and FIG. 5 is a view taken generally on line 5—5 of FIG. 4, with parts broken away to show details of construction.

DESCRIPTION OF ILLUSTRATED EMBODIMENT

Figure 1:
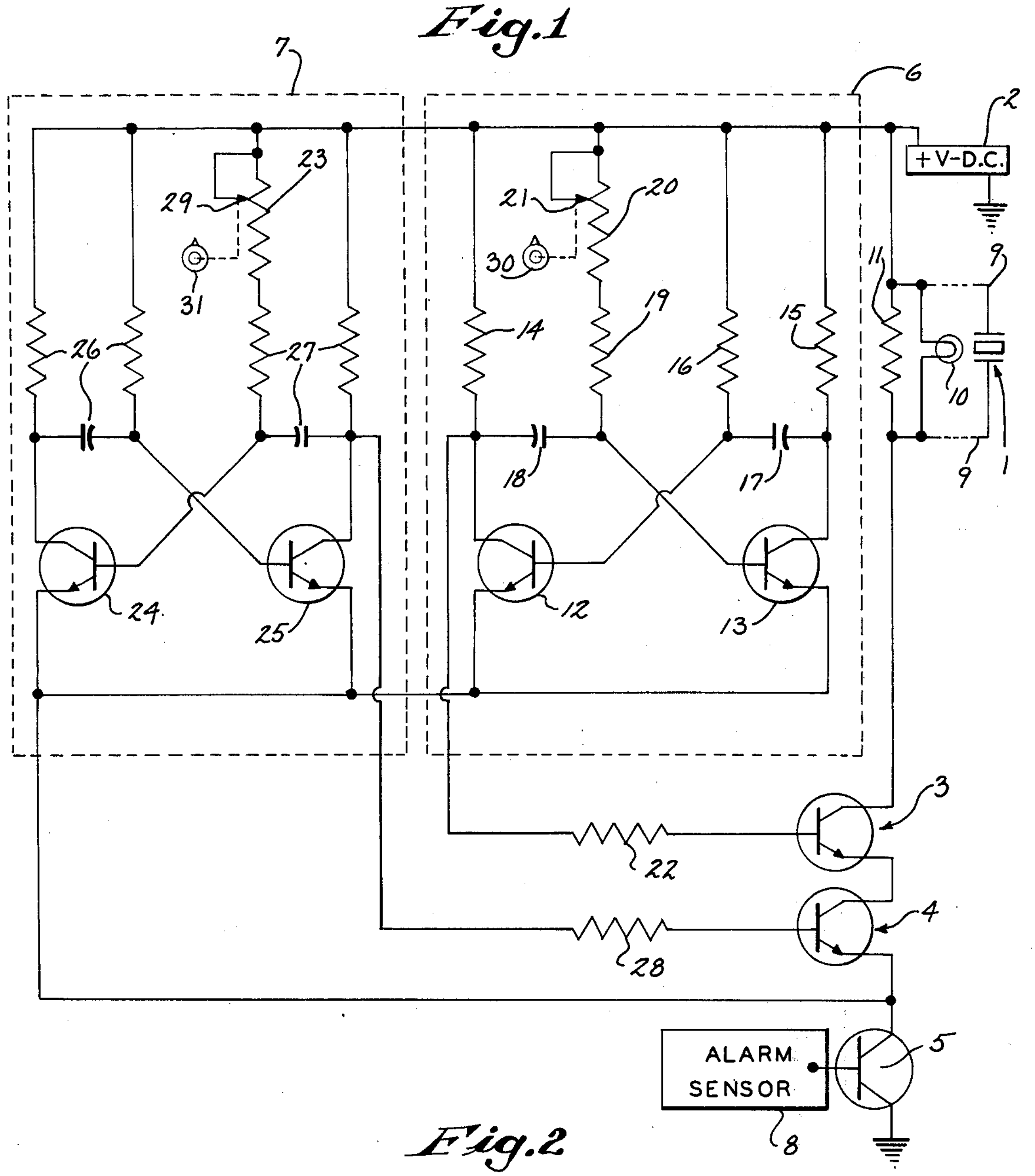
FIG. 1 is a schematic circuit illustration of a crystal alarm unit constructed in accordance with the teaching of the present invention.

Referring to the drawings and particularly to FIG. 1 an electro-acoustical transducer 1 is illustrated connected across a suitable DC voltage supply 2 in series with a pair of switching transistors 3 and 4 and an alarm responsive control transistor 5. The electro-acoustical transducer 1 is a suitable crystal which will generate a sound when excited from a relatively high audio frequency electrical signal of a frequency in the audio range. Further, the sound generated by the crystal 1 varies in pitch and amplitude as the energizing frequency varies. In accordance with the illustrated embodiment of the invention, a first audio frequency multivibrator 6 is connected as a tone generator to control the transistor 3 and thereby provide for the selective application of the power to the crystal 1 at any one of a plurality of audio frequency rates. A similar subaudio frequency multivibrator 7 is connected as a beep rate generator to control the transistor 4 at a much lower frequency and thus effectively opens and closes the circuit to effectively couple and decouple the tone generator or multivibrator 6 from the crystal 1. An alarm sensor 8, which is any suitable means which will respond to the condition being monitored, provides a signal to the transistor 5 and permits energizing of the transducer 1 in response to an alarm status.

Each of the transistors 3 – 5 is shown as a similar NPN transistor with the collector to emitter circuits connected in series with each other between the transducer and ground. Thus each acts as a series switch in controlling the application of power to the crystal transducer 1. The base of the respective transistors 3 and 4 are connected to the output of the switch driving multivibrators 6 and 7, each of which is generally similarly constructed as a free-running multivibrator having a continuously variable duty cycle. The base of transistor 5 is connected to the alarm sensor 8 and is held off in the absence of an alarm condition. The transistor 5 is connected as the ground return of the multivibrators 6 and 7 as well as the series energizing circuit of transducer 1 and thereby holds the complete circuit in standby until an alarm status is encountered.

The crystal 1 can be connected into the circuit through suitable leads 9 permitting remote location with respect to the control circuit, if desired or required. A lamp 10 and a resistor 11 may be connected in parallel with the transducer 1 to provide a visual indication of the particular alarm which has been activated. The DC input resistance of the crystal is very high and the resistor 11 will ensure the initial turn on of the series transistors 3 and 4. The lamp 10 may of course be located adjacent the audible alarm 1 or in a separate signal board or bank, not shown.

Both of the multivibrators 6 and 7 provide a square wave output with the duty cycle independently adjustable as presently described to thereby provide a dual control of the energization of the crystal 1. The on/off switching of the transistor 4 turns the circuit for crystal 1 on and off at the relative slow rate. The transistor 3 is turned on and off by the square wave output of generator 6 at a much higher frequency and, when switch 4 is on, correspondingly excites the crystal at the frequency level.

The crystal 1 is therefore connected to supply 2 for excitation from a non-sinusoid source and in particular in accordance with a rectangular wave. As a result the crystal 1 will be operated at the fundamental sine wave frequency of the rectangular wave signal of generator 6 and a plurality of accompanying harmonics. The combination of the fundamental and harmonic excitation creates sound which is much fuller than that associated with only the natural resonant sinusoid and will present a more acceptable sound. Further, a change in the rectangular wave basic repetition rate or frequency creates a corresponding charge in the fundamental sine wave frequency and the accompanying harmonics. The sound pitch of the crystal 1 is directly related to the basic repetition rate. By providing a continuously variable frequency control, various similar alarm devices may vary in pitch.

In addition, a maximum intensity signal is established when the crystal 1 is excited with a rectangular wave having a fundamental frequency corresponding to the mechanical resonant frequency of the crytal. Variation of the basic repetition rate and thus the fundamental frequency of the rectangular wave above or below such natural resonant frequency results in a correspondingly decreased sound level or amplitude. The tone generator 6 therefore provides a combined amplitude and tone control integrated into a single control unit. This is particularly desirable when combined with the variable duty cycle of the rate generator 7 which through the corresponding switching of the transistor 4 produces an interrupted sound signal.

More particularly, the tone generator 6 is a free running oscillator 6 having a pair of NPN transistors 12 and 13 connected to the power supply 2, with collector load resistors 14 and 15. The base of transistor 12 is connected to the supply 2 through a resistor 16 and through a capacitor 17 in series with the load resistor 15 of the transistor 13 and thus to the collector of such transistor. The base of the transistor 13 in turn is similarly connected in series with a capacitor 18 to the collector of the transistor 12. A resistor 19 in series with a potentiometer 20 is connected directly between the base of the transistor 13 and the supply 2. The potentiometer 20 includes a variable tap 21 for controlling the resistance of the bias and coupling connection.

The transistors 12 and 13 are shown as common emitter connected NPN transistors connected to a common ground by the transistor 5 and with their collectors connected through the load resistances to the voltage source 2. The collectors of the two transistor 12–13 are connected by the capacitors 17 and 18 to the base of the opposite transistor and each transistor in turn has a turn on bias resistor connected between the base and the power supply 2.

In accordance with usual operation, the coupling capacitors 17 and 18 are charged and then discharge through the paralleled resistors, with the resistance level controlling the conduction period and initiation of the conduction by the opposite transistor. The period of the capacitor 17 is fixed as the resistors 15 and 16 are fixed. The period of the capacitor 18 is adjustable in accordance with the setting of the potentiometer 20. Thus, the time required for the capacitor 18 to discharge and allow the transistor 13 to conduct, and thereby turn off transistor 12, is set by the potentiometer. Driving transistor 12 on and off results in a corresponding change of collector voltage between the supply voltage level and ground. The circuit continuously operates with alternate conduction of the transistors 12 and 13 and thereby generating a relatively essentially rectangular wave output signal at the collector of transistor 12.

This rectangular wave signal is applied via a resistor 22 to the base of the transistor 3. When the transistor 12 is driven into saturation, the collector is essentially at ground and the transistor 3 will be biased off. When the transistor 12 is cut off however, the collector voltage rapidly rises to the supply voltage thereby driving the transistor 3 on. Thus the transistor 3 is driven on and off at the pulse rate established by the square wave signals appearing at the collector of the transistor 12 which, in turn, is controlled by the setting of potentiometer 20. This of course will in turn provide a corresponding energization of the crystal transducer 1 from the supply if the rate control transistor 4 and the alarm control transistor 5 are both on and conductive.

The multivibrator 7 is similar to the multivibrator 6, with a variable potentiometer 23 connected into the circuit to control the on/off timing period of the transistor 4. Thus, the multivibrator 7 includes a pair of transistors 24 and 25 connected to the supply 2 and with each of the bases connected to the supply to the output of the opposite transistor through resistance-capacitance networks 26 and 27. The collector of transistor 25 is connected by a resistor 28 to the base of transistor 4. The variable potentiometer 23 in network 27 includes an adjustable tap 29 permitting adjustment of the duty cycle of generator 7 and particularly the voltage at the collector of transistor 25 in the same basic manner as a multivibrator 6.

Although the multivibrator circuits 6 and 7 are illustrated in a similar manner, the components are selected to provide widely varying pulse repetition rates. Thus the pulse generator 6 as previously noted provides an output in the audio frequency range; for example, in the range of 3,000 Hertz (3KHz). The beep or rate interruption generator 7 on the other hand will operate at a much lesser frequency, for example, on the order of 5 pulses per second, with a duty cycle of 20% to 50% of the total time period. Thus, the transistor 25 will be cut off from 20 to 50% of each total on/off period to produce a corresponding on time of the transistor 4 during which period, the switching of transistor 3 energizes the crystal 1 to create a corresponding sound signal, if the alarm condition is sensed to hold transistor 5 on.

In summary, the oscillator 7 is set to preselect the alarm signal rate in response to an alarm condition while oscillator 6 is set to vary not only the tone or pitch of the associated alarm but to simultaneously vary the level of the sound. The two settings thus provide a means to vary the signal rate as well as its pitch and its amplitude. A plurality of different conditions can therefore be simultaneously monitored by a corresponding plurality of units and an actuation of a particular alarm more readily and rapidly detected. Further, the non-sinusoidal excitation provides a very distinct improvement in the "heard" sound characteristic and adapts the system to areas where an alarm condition is often the rule rather than the exception.

Figure 2:
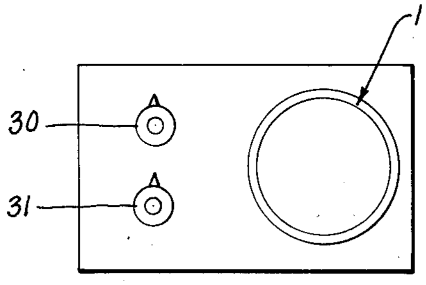
FIG. 2 is a diagrammatic illustration of a packaged unit such as shown in FIG. 1.

The circuit can be readily formed as a small, compact package, such as shown in FIG. 2, with external controls for setting of the potentiometers 20 and 23. In FIGS. 1 and 2, rotatable control knobs 30 and 31 are coupled to the respective taps 21 and 29 for selectively controlling the presetting of the particular sound characteristic.

Although the present invention can employ any suitable packaging, a particular satisfactory and novel construction is shown in FIGS. 3 - 5.

Referring particularly to FIG. 3, the crystal transducer 1 and associated circuitry is mounted within a separate housing or unit 32 having power leads for connection to the variable DC supply 2. A plug-in type coupling 33 provides a convenient circuit connection to the potentiometers 20 and 23.

Referring particularly to FIGS. 4 and 5, the unit 32 includes a housing 34 having a circuit module 35 clamped within the housing by a suitable clamping ring 36 which is attached to the housing by suitable attachment screws. A connecting cable 37 includes the leads to the releasable connector unit 33 and to the supply 2.

The housing 34 includes an inner base 38 spaced slightly from the module 35 and defines an outer chamber or cavity within which the transducer 1 is especially mounted. The base 38 is formed with an annular ridge 39 within the transducer cavity.

The crystal transducer 1 is generally a multi-layer wafer or disc-like unit with a smaller electrode plate 40 slightly larger than the diameter of the ridge 39 and a larger plate 41. The transducer is mounted with plate 40 abutting the ridge 39. The ridge 39 has a triangular cross section as shown in FIG. 2 to define a line type support for the transducer 1.

The transducer 1 is secured to the ridge 39 by a suitable adhesive 42 such as a silicon rubber, with the crystal lying flat completely about the ridge. The amount of adhesive employed should be the minimum amount necessary to firmly attach the crystal so as not to inerfere with the desired sound producing characteristics of the crystal element.

The housing base 38 includes a suitable opening 43 which extends through the ridge 39 to receive the connecting leads 9 which are connected respectively one each to the two elements of the transducer 1 as shown in FIGS. 1 and 4.

The outer wall 44 of housing 34 which further defines the transducer cavity is of a slightly greater diameter than the maximum diameter of the crystal plate 41 to establish and maintain a continuous space or gap 45 between the periphery of the crystal and the housing wall 44 to permit free operation of the excited crystal.

A special lens unit 46 has a mounting flange 47 with an outer diameter generally corresponding to the inner diameter of the annular wall 44. The flange 47 and wall 44 are similarly threaded. The lens unit 46 is threaded into the housing and firmly interconnected with wall 44 by a suitable adhesive bonding material 48.

An annular projection 49 on the innermost face of the lens 46 defines an annular ridge abutting the transducer 1. The ridge 49 has a similar triangular end cross section, with the line apex accurately aligned with the line contact provided by corresponding ridge 39. The lens unit 46 is secured in the housing 44 with the line edge of projection 49 in firm engagement with the transducer 1. Thus, lens unit 46 is threaded into wall 44 until a firm engagement with the crystal 1 is made after which it is sealed in place by the adhesive 48. The clamping ridges 39 and 49 are selected to produce the desired accurate node mounting of the crystal 1.

A plurality of openings 50 are formed in the flange 47 of lens unit 46 outwardly of the ridge 49. As shown in FIG. 5, the illustrated embodiment of the invention has first and second groups of openings 50 provided in diametrically opposite side portions with the openings symmetrically spaced and with approximately 30° between the openings. Additional top and bottom openings 50 are also shown.

The inner portion of the lens unit 46 is recessed to define a cavity 51 within ridge 49 and having an outer base wall 52 spaced from the crystal 1. The base wall 52 of the cavity in turn includes a central sound transmitting opening 53, which leads to a stepped outer recess in the outermost face of the lens unit 46.

A sound reflector disc 54 is secured in spaced overlying relation to the opening 53 within the outer recess and attached to a flat wall 55 defined by the stepped construction. The disc 54 has a slightly smaller diameter than that of the outermost portion of the recess and is provided with a plurality of three equicircumferentially spaced pads 56 on the outer edge portion. The pads 56 project radially therefrom with the outer edges lying on a diameter essentially corresponding to the diameter of the outer recess. The pads 56 rest on the wall 55 and hold the disc with a slight space 57 about the periphery. The disc 54 is secured in position by a suitable adhesive 58 between the pads 56 and the supporting wall 55.

The outer wall 42 of the lens unit 46 may be threaded as shown for mounting within an opening by a suitable mounting nut, not shown.

The housing components 34, 36 and 47 as well as disc 54 can, of course, be formed of any suitable material, those illustrated being a suitable plastic such as a general purpose ABS plastic.

The the sound generated by the electrical energization of the crystal transducer 1 is transmitted through the transmitting opening 53 and about the reflector disc. The size of the transducer cavity, as well as the relative placement of the mounting node produced by ridges 39 and 49 and the reflector disc 54 all contribute to optimum sound transmission. For example, in a satisfactory unit such as shown in FIGS. 4 and 5, the mounting node 39 had a diameter of 0.812 inches with the depth of the cavity to the transmission opening 53 being 0.375 inches and to the disc 54 being 0.562 inches. The intermediate wall or base had a thickness of approximately 0.125 inches with a transmission opening diameter of approximately 0.250 inches. The disc 54 was 0.025 inch thick ABS plastic of a diameter of 0.650 inches and was spaced from the opening by 0.112 inches. The spacing was formed by spacing of the ridge wall approximately 0.062 inches outwardly and pads 56 having a thickness of 0.050 inches. The outer recess projects outwardly a total of 0.250 inches with the diameter of the inner portion approximately 0.625 inches and the outer portion 0.750 inches. The system was driven from a 22 volt variable DC supply 2 and gave an output signal with the DC voltages above ten volts DC.

It has been found that the illustrated mounting provides a particularly satisfactory method of generating a sound signal in response to energization of the crystal transducer from the preferred circuit such as shown in FIG. 1.

The present invention thus provides an alarm having means varying the basic pitch and amplitude of the tone signal, as well as controlling the interruption of such signal to further vary the sound characteristic. The unit can be physically compact and driven over from a wide range of available supply voltages.

Various modes of carrying out the invention are contemplated as being within the scope of the following claims, particularly pointing out and distinctly claiming the subject matter which is regarded as the invention.

We claim:

1. A crystal sound generating apparatus comprising a housing including a base member from which a substantially circumferential mounting ridge extends for defining a first line contact surface; a plate like crystal unit for generating an audible sound in response to electrical energization thereof, said crystal being affixed to said first line contract surface; a lens unit secured to said housing and having (1) an annular wall provided with a central opening and spaced from said crystal unit such that said annular wall and crystal unit substantially define a cavity within said lens unit, (2) a circumferential clamping projection extending from said lens unit and aligned with said mounting ridge such that said clamping projection defines a second line contact surface engaging said crystal unit, and (3) a flange portion which together with said housing, said mounting ridge and said clamping projection define an annular chamber into which the crystal unit extends, said flange portion having a plurality of ports formed therein such that said annular chamber is coupled to the ambient; and a reflector disc secured to said lens unit exteriorly of said cavity in a spaced overlying relationship to said central opening such that audible sound generated by electrical energization of said crystal unit is transmitted through said ports and central opening.

* * * * *

UNITED STATES PATENT OFFICE
CERTIFICATE OF CORRECTION

PATENT NO. : 4,056,741

DATED : November 1, 1977

INVENTOR(S) : Richard D. Hoerz and Donald J. Propp

It is certified that error appears in the above-identified patent and that said Letters Patent are hereby corrected as shown below:

Col. 4, line 66, after "energization" insert the word -- rate --.

Col. 5, line 16, "charge" should read -- change --.

Col. 7, line 36, "iner-" at the end of the line should read -- inter- --.

Col. 9, line 14, "contract" should read -- contact --.

Signed and Sealed this

*Seventh* Day of *March 1978*

[SEAL]

*Attest:*

RUTH C. MASON
*Attesting Officer*

LUTRELLE F. PARKER
*Acting Commissioner of Patents and Trademarks*